United States Patent
Van Duren et al.

(10) Patent No.: US 9,034,690 B2
(45) Date of Patent: May 19, 2015

(54) METHODS FOR FORMING BACK-CHANNEL-ETCH DEVICES WITH COPPER-BASED ELECTRODES

(71) Applicant: Intermolecular, Inc., San Jose, CA (US)

(72) Inventors: Jeroen Van Duren, Palo Alto, CA (US); Sang Lee, San Jose, CA (US); Zhi-Wen Sun, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/133,421

(22) Filed: Dec. 18, 2013

(65) Prior Publication Data

US 2014/0273341 A1 Sep. 18, 2014

Related U.S. Application Data

(60) Provisional application No. 61/778,986, filed on Mar. 13, 2013.

(51) Int. Cl.

| | |
|---|---|
| *H01L 21/16* | (2006.01) |
| *H01L 21/306* | (2006.01) |
| *H01L 27/12* | (2006.01) |
| *H01L 21/02* | (2006.01) |
| *H01L 29/66* | (2006.01) |
| *H01L 29/786* | (2006.01) |
| *H01L 21/465* | (2006.01) |
| *H01L 21/70* | (2006.01) |

(52) U.S. Cl.
CPC ...... *H01L 21/30604* (2013.01); *H01L 27/1225* (2013.01); *H01L 21/02565* (2013.01); *H01L 21/02631* (2013.01); *H01L 29/66969* (2013.01); *H01L 29/7869* (2013.01); *H01L 21/465* (2013.01); *H01L 21/707* (2013.01)

(58) Field of Classification Search
CPC ............ H01L 27/1225; H01L 29/7869; H01L 29/66969
USPC .................. 438/104, 151, 158, 687, 745, 754
See application file for complete search history.

(56) References Cited

U.S. PATENT DOCUMENTS

| | | | |
|---|---|---|---|
| 7,682,882 B2 | 3/2010 | Ryu et al. | |
| 7,696,088 B2 | 4/2010 | Long et al. | |
| 2010/0320457 A1* | 12/2010 | Matsubara et al. | ............ 257/43 |
| 2014/0151682 A1* | 6/2014 | Saito et al. | ....................... 257/43 |
| 2014/0162403 A1* | 6/2014 | Okabe et al. | .................. 438/104 |

* cited by examiner

*Primary Examiner* — Kevin M Picardat

(57) ABSTRACT

Embodiments described herein provide methods for forming indium-gallium-zinc oxide (IGZO) devices. A substrate is provided. An IGZO layer is formed above the substrate. A copper-containing layer is formed above the IGZO layer. A wet etch process is performed on the copper-containing layer to form a source region and a drain region above the IGZO layer. The performing of the wet etch process on the copper-containing layer includes exposing the copper-containing layer to an etching solution including a peroxide compound and one of citric acid, formic acid, malonic acid, lactic acid, etidronic acid, phosphonic acid, or a combination thereof.

19 Claims, 8 Drawing Sheets

| ACID | Cu (nm) | H2O2 (mL) | ACID (mL) | H2O (mL) | TOTAL (ml) | RATIO | H2O2 wt.-% | TIME (sec) | Cu ER (nm/s) | IGZO ER (nm/s) | SELECTIVITY |
|---|---|---|---|---|---|---|---|---|---|---|---|
| Etidronic | 83.5 | 4.00 | 1.00 | 8.00 | 13.00 | 4.00 | 9 | 2 | 41.8 | 0.10 | 418 |
| Etidronic | 83.5 | 1.00 | 1.00 | 6.00 | 8.00 | 1.00 | 4 | 15 | 5.6 | 0.15 | 37 |
| Formic | 92.0 | 1.00 | 8.00 | 0.00 | 9.00 | 0.13 | 3 | 20 | 4.6 | 0.23 | 20 |
| Formic | 92.0 | 1.00 | 1.00 | 6.00 | 8.00 | 1.00 | 4 | 15 | 6.1 | 0.25 | 25 |
| Lactic | 92.0 | 1.00 | 1.00 | 6.00 | 8.00 | 1.00 | 4 | 33 | 2.8 | 0.13 | 21 |
| Citric | 83.5 | 2.00 | 2.00 | 12.00 | 16.00 | 1.00 | 4 | 30 | 2.8 | 0.06 | 50 |
| NTMP | 83.5 | 2.00 | 2.00 | 12.00 | 16.00 | 1.00 | 4 | 19 | 4.4 | 0.06 | 79 |

METHODS FOR FORMING BACK-CHANNEL-ETCH DEVICES WITH COPPER-BASED ELECTRODES

CROSS-REFERENCE TO RELATED APPLICATIONS

This application claims priority to U.S. Provisional Application Ser. No. 61/778,986 filed on Mar. 13, 2013, which is herein incorporated by reference for all purposes.

TECHNICAL FIELD

The present invention relates to back-channel-etch (BCE) devices, such as BCE transistors. More particularly, this invention relates to methods for forming BCE indium-gallium-zinc oxide (IGZO) transistors with copper-based source and drain electrodes.

BACKGROUND OF THE INVENTION

Indium-gallium-zinc oxide (IGZO) devices, such as IGZO thin-film transistors (TFTs) have attracted a considerable amount of attention due to the associated low cost, room temperature manufacturing processes with good uniformity control, high mobility for high speed operation, and the compatibility with transparent, flexible, and light display applications. Due to these attributes, IGZO TFTs may even be favored over low cost amorphous silicon TFTs and relatively high mobility polycrystalline silicon TFT for display device applications.

Manufacturing IGZO TFTs often involves the use of an etch stop layer to protect the IGZO channel during the etch process used to define the source and drain electrodes (or regions), which adds to overall costs. When an etch stop layer is not used, the device is sometimes referred to as a "back-channel-etch" (BCE) device.

BCE device manufacturing requires a source/drain patterning step with a high (etch) selectivity of the source/drain material over the IGZO layer during the source/drain patterning, and minimal damage to the IGZO surface, which may impact the performance of the TFT. Currently, few options exist for performing this process on IGZO devices, which utilize inexpensive, readily available materials.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 7 is a table of data related to various samples of wet etch solutions according to some embodiments.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Some embodiments described herein provide improved chemistries for wet etch solutions used to form/selectively etch copper-based source and drain regions in, for example, indium-gallium-zinc oxide (IGZO) devices, such as IGZO thin-film transistors (TFTs). Some embodiments may result in an etch selectivity of 25× for copper-based materials over IGZO, thus minimizing any damage that may occur to the IGZO channel during the etching process. As will be appreciated by one skilled in the art, "etch selectivity" may refer to the ratio of the etch rate of one material (e.g., copper) to the etch rate of another material (e.g., IGZO).

In some embodiments, the wet etch solution includes a peroxide, such as hydrogen peroxide, and an organic acid (e.g., in water or deionized water). The organic acid may include citric acid, formic acid, malonic acid, lactic acid, etidronic acid, phosphonic acid, or a combination thereof. An indium-based salt, a gallium-based salt, and/or a zinc-based salt may be added to the solution to increase the etch selectivity. After the source and drain region are formed, the portion of the IGZO therebetween may be exposed to an acidic solution comprising hydrofluoric acid and/or hydrochloric acid.

Figure 1:
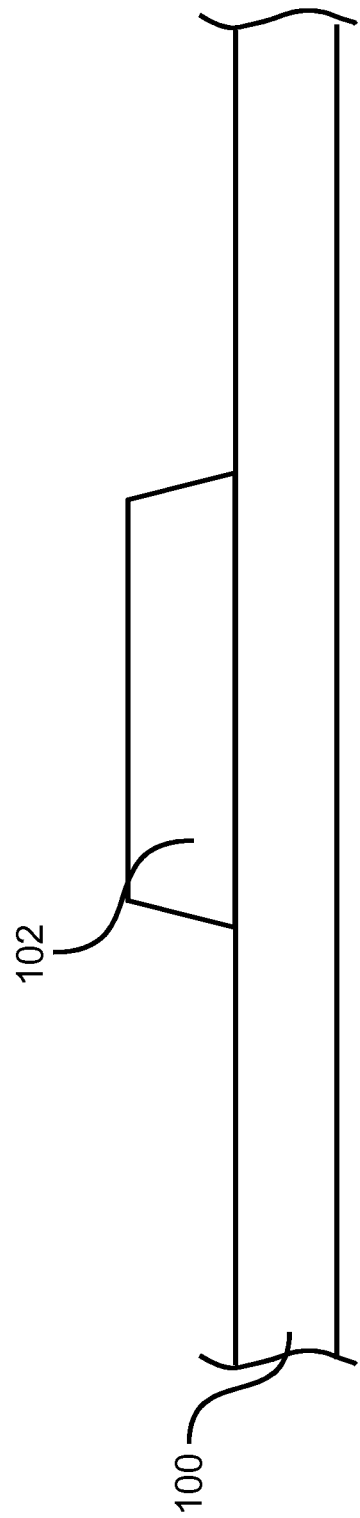
FIG. 1 is a cross-sectional view of a substrate with gate electrode formed above.

FIGS. 1-6 illustrate a method for forming a thin-film transistor (TFT) (e.g., such as an IGZO TFT), according to some embodiments. Referring now to FIG. 1, a substrate 100 is shown. In some embodiments, the substrate 100 is transparent and is made of, for example, glass, such as float glass, low-iron glass, borosilicate glass, display glass, alkaline earth boro-aluminosilicate glass, fusion drawn glass, flexible glass, specialty glass for high temperature processing. The substrate may also be made of, for example, polyimide, plastics, polyethylene terephthalate (PET). In embodiments in which transparency is not needed, the substrate may be made of, for example, aluminum foil, stainless steel, carbon steel, paper, cladded foils, etc. The substrate 100 may have a thickness of, for example, between 5 micrometer and 4 millimeters. Although only a portion of the substrate 100 is shown, it should be understood that the substrate 100 may have a width of, for example, between about 5.0 cm and about 4.0 meters (m). Although not shown, in some embodiments, the substrate 100 may have a dielectric, and/or diffusion barrier (e.g., silicon oxide, silicon nitride, or silicon oxy-nitride), and/or one or more adhesion layers (e.g., titanium or chromium) formed above an upper surface thereof. In some embodiments, the components described below are formed above the dielectric layer.

Still referring to FIG. 1, a gate electrode 102 is formed above the transparent substrate 100. In some embodiments, the gate electrode 102 is made of a conductive material, such as copper, silver, aluminum, manganese, molybdenum, titanium, tantalum, tungsten, or a combination thereof (e.g., alloys). Typical copper alloys include copper-magnesium-aluminum, and copper-manganese. The copper alloys may also contain small concentrations of phosphides, magnesium, or calcium. In some embodiments, the gate electrode 102 includes two or more sub-layers (e.g., an aluminum sub-layer and a molybdenum sub-layer, a copper sub-layer and a molybdenum sub-layers, etc.). It should be noted that any aluminum used in the gate electrode may contain a small concentration of neodymium. For some transparent TFTs, the gate electrode 102 may consist of a transparent conductive oxide, (e.g. indium-tin oxide (ITO), indium-zinc oxide (IZO)), and related materials.

The gate electrode may have a thickness of, for example, between about 30 nanometers (nm) and about 500 nm. Although not shown, it should be understood that in some embodiments, a seed layer is formed between the substrate 100 and the gate electrode 102. In some embodiments, the seed layer includes copper and has a thickness of, for example, between about 1 nm and about 5 nm. The seed layer may be made of, for example, copper-manganese alloy (e.g., 96-99% copper and 1-4% manganese).

It should be understood that the various components on the substrate, such as the gate electrode 102 and those described below, are formed using processing techniques suitable for the particular materials being deposited, such as physical vapor deposition (PVD), atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), pulsed laser deposition (PLD), evaporation, electroplating, etc. Generally, because of the structure and size of the display devices, PVD or PECVD are preferred methods of formation. However, any of these techniques are suitable for forming each of the various layers discussed herein. Those skilled in the art will appreciate that the teachings described herein are not limited by the technology used for the deposition process.

Furthermore, although not specifically shown in the figures, it should be understood that the various components on the substrate 100, such as the gate electrode 102, may be sized and shaped using a photolithography process (e.g., the deposition, patterning, and removal of a photoresist layer) and an etching process, as is commonly understood, such that the components are formed above selected regions of the substrate 100.

Figure 2:
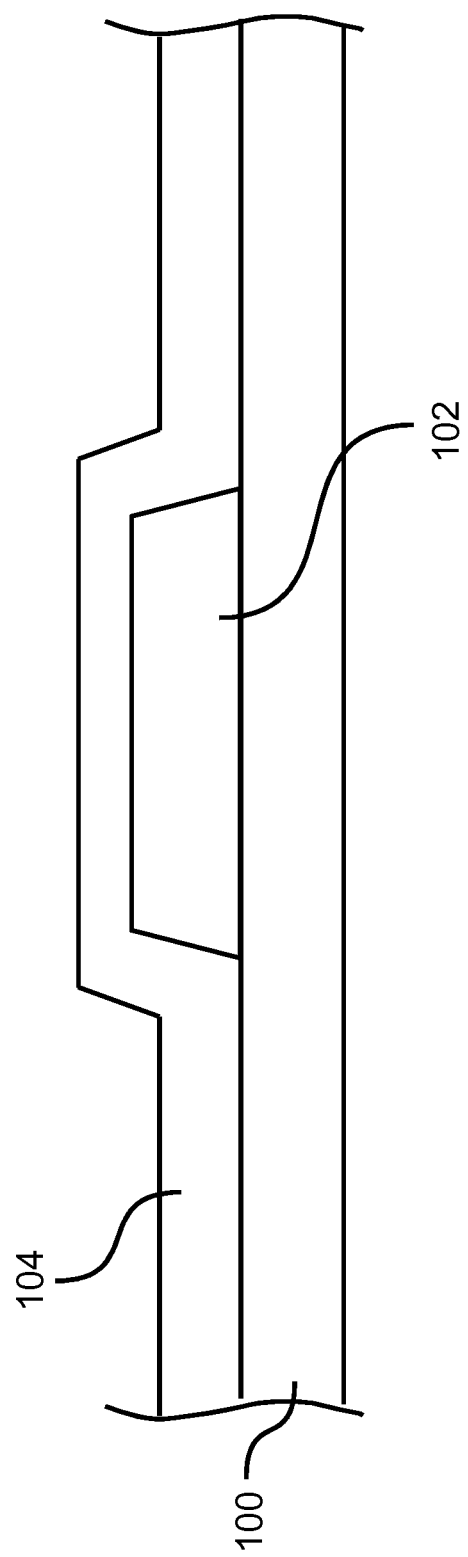
FIG. 2 is a cross-sectional view of the substrate of FIG. 1 with a gate dielectric layer formed above the gate electrode and the substrate.

Referring to FIG. 2, a gate dielectric layer 104 is then formed above the gate electrode 102 and the exposed portions of the substrate 100. The gate dielectric layer 104 may be made of, for example, silicon oxide, silicon nitride, or a combination thereof. In some embodiments, the gate dielectric layer 104 includes a high-k dielectric material (e.g., having a dielectric constant greater than 3.9), such as hafnium oxide, zirconium oxide, or titanium oxide, and/or a high bandgap material, such as aluminum oxide. In some embodiments, the gate dielectric layer 104 has a thickness of, for example, between about 30 nm and about 500 nm.

Figure 3:
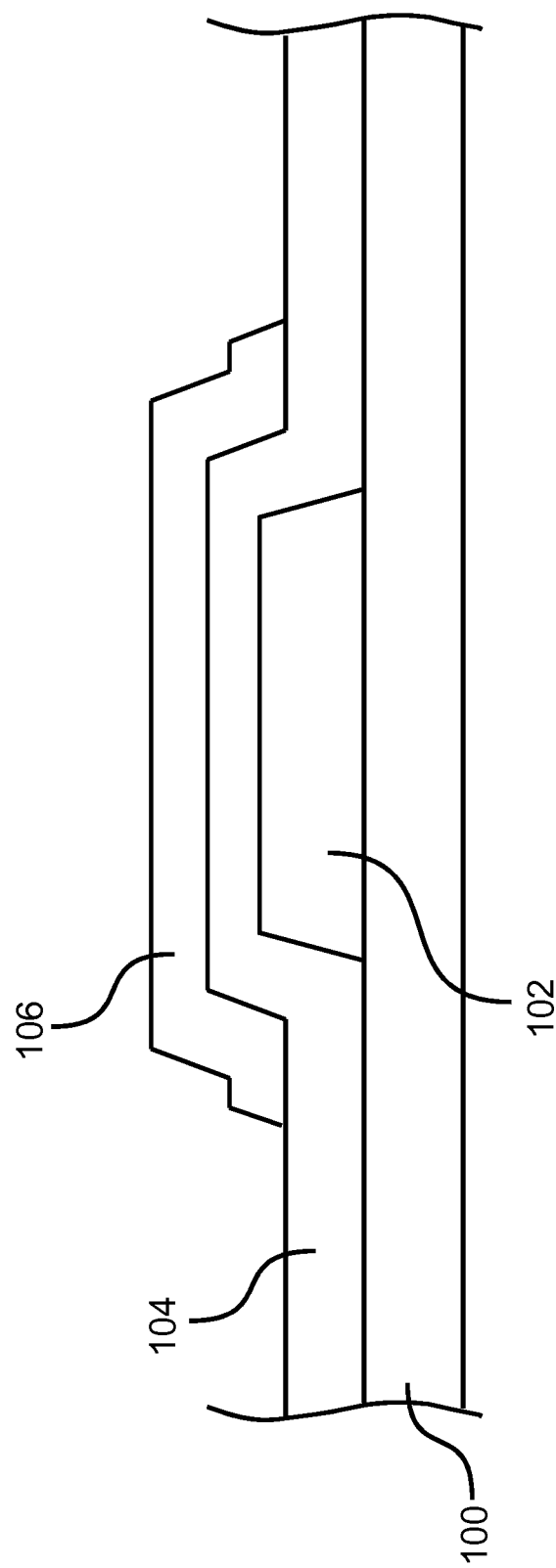
FIG. 3 is a cross-sectional view of the substrate of FIG. 2 with an indium-gallium-zinc oxide (IGZO) channel layer formed above the gate dielectric layer.

As shown in FIG. 3, a channel layer (or active layer) 106 is then formed above the gate dielectric layer 104, over the gate electrode 102. The channel layer 106 may be made of amorphous IGZO (a-IGZO) in which a ratio of the respective elements is 1:1:1:1-3. Other suitable examples include indium-zinc oxide (IZO), zinc-tin oxide (ZTO), hafnium-indium-zinc oxide (HIZO), and aluminum-zinc-tin oxide (AZTO), oxy-nitrides such as zinc oxy-nitride (ZnON), indium oxy-nitride (InON), tin oxy-nitride (SnON), c-axis aligned crystalline (CAAC) materials such as CAAC-IGZO, or polycrystalline materials such as zinc oxide or indium-gallium oxide (IGO). Indium in these materials may be partially or completely replaced by tin or antimony. Gallium in these materials might be partially or completely replaced by one or more of aluminum, hafnium, indium, niobium, silicon, tin, tantalum, titanium, zinc, or zirconium. Oxygen in these materials might be partially or completely replaced by one or more of carbon, nitrogen, phosphorous, sulfur, selenium, silicon, or tellurium. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for zinc oxide-based semiconductors are aluminum, boron, chromium, gallium, hydrogen, indium and lithium. Furthermore, the metal cations in the metal-based semiconductor material (e.g. IGZO) may be partially or completely replaced by silver, arsenic, gold, bismuth, cadmium, copper, zinc, gallium, germanium, mercury, indium, lead, antimony, tin, and thallium. Other dopants of interest include halogens like chlorine and fluorine. This disclosure will use IGZO as an example, but this is not meant to be limiting. The techniques described herein can be applied to any material suitable for display applications.

The channel layer 106 may have a thickness of, for example, between about 20 nm and about 50 nm. In some embodiments, the IGZO is deposited from a single target in a PVD tool, which includes indium, gallium, and zinc (e.g., an indium-gallium-zinc alloy target or an IGZO target), while in some embodiments, two or more targets are used (e.g., co-sputtering with an indium-zinc target and a gallium target).

Although not specifically shown, is some embodiments, the channel layer 106 (and the other components shown in FIG. 4) may then undergo an annealing process. In some embodiments, the annealing process includes heating the IGZO channel layer 106, along with the other components shown in FIG. 3, to a temperature of, for example, between about 200° C. and about 800° C. for between about 30 minutes and about 120 minutes.

Figure 4:
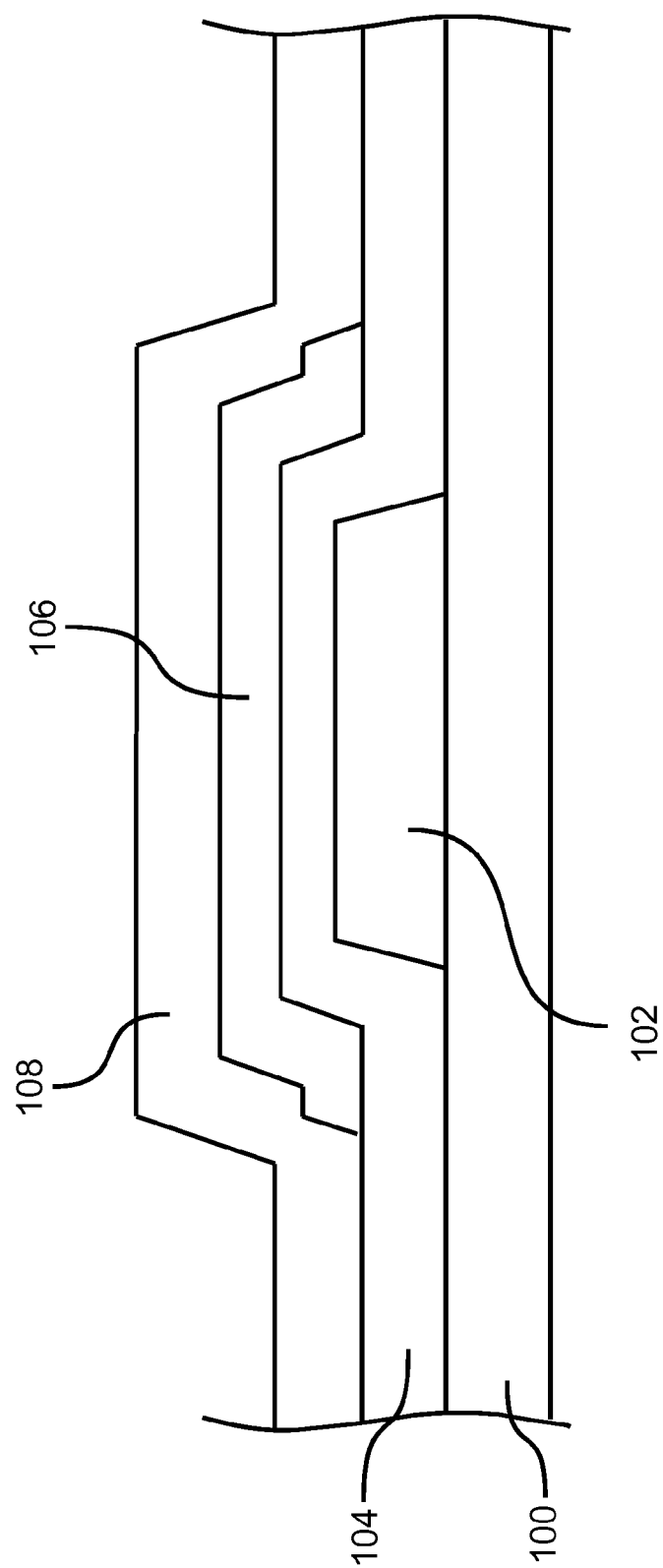
FIG. 4 is a cross-sectional view of the substrate of FIG. 3 with an electrode layer formed above the IGZO layer.

Referring now to FIG. 4, an electrode (or source/drain) layer 108 is then formed above the channel layer 106. In some embodiments, the electrode layer 108 includes (e.g., is made of) copper. In some embodiments, the electrode layer 108 includes copper along with other materials, such as silver, aluminum, manganese, molybdenum, titanium, or a combination thereof (e.g., alloys). Typical copper alloys include copper-magnesium-aluminum, and copper-manganese. The copper alloys may also contain small concentrations of phosphides, magnesium, or calcium. In some embodiments, the electrode layer 108 includes two or more sub-layers (e.g., an aluminum sub-layer and a molybdenum sub-layer, a copper sub-layer and a molybdenum sub-layer, two molybdenum sub-layers with a copper sub-layer in between, or two copper-manganese alloy sub-layers with a copper sub-layer in between, etc.). It should be noted that any aluminum used in the electrode layer 108 may contain a small concentration of neodymium. For some transparent TFTs, the electrode layer 108 may consist of a transparent conductive oxide, (e.g. indium-tin oxide (ITO), indium-zinc oxide (IZO)), and related materials. The electrode layer 108 may have a thickness of, for example, between about 50 nm and 0.5 micrometers ($\mu$m) (or more in some embodiments).

Figure 5:
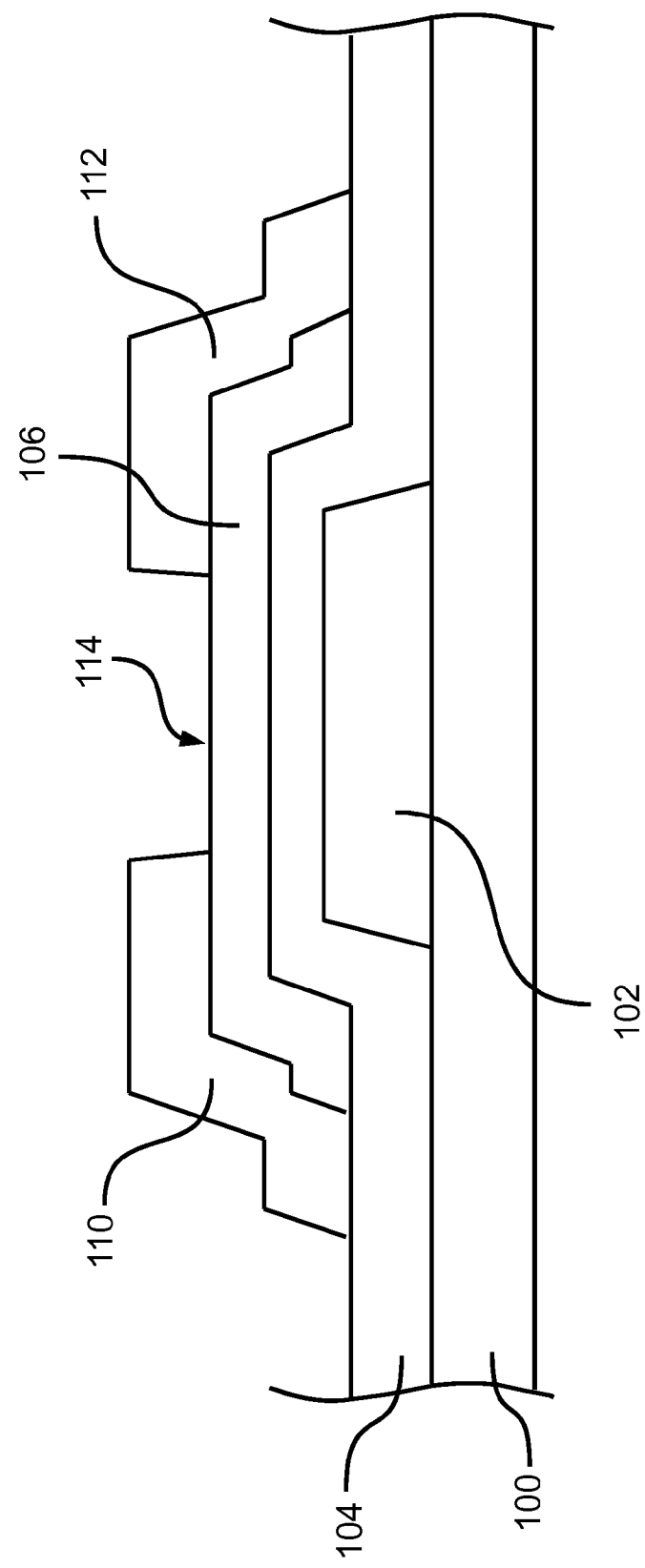
FIG. 5 is a cross-sectional view of the substrate of FIG. 4 with source and drain regions formed above the IGZO.

Next, as shown in FIG. 5, a source region (or electrode) 110 and a drain region 112 (or more generally, copper-containing regions 110 and 112 in some embodiments) are then formed from the electrode layer 108. As will be appreciated by one skilled in the art, the source and drain regions 110 and 112 may be formed by performing a selective wet etch process on the electrode layer 108 (e.g., using a photolithography process). In some embodiments, the wet etch process is a "back-channel-etch" (BCE) process, as no etch stop layer is formed above the channel layer 106 before the deposition of the electrode layer 108.

In some embodiments, the wet etch process includes exposing the electrode layer 108 to a wet etch solution (or formulation) that includes a peroxide compound and an organic acid (e.g., in water or deionized water). The wet etch solutions described herein may have an etch selectivity as high as 25× for copper-based materials over, for example, IGZO.

Exemplary peroxide compounds include organic peroxides, such peroxy acids, and organic hydroperoxides, such as ascaridole, benzoyl peroxide, lauroyl peroxide, tert-butyl peroxide, cyclo butane malonyl peroxide, 2,4-pentanedione peroxide, etc., and inorganic peroxides, such as hydrogen peroxide, peroxymonosulfuric acid, in addition to peroxide salts, such as alkali, alkaline earth, and transition metal peroxide salts, as well as combinations thereof. It should be understood that although hydrogen peroxide may be referred to in the embodiments described below, any of the examples described above may be used as the peroxide compound.

The organic acid may include citric acid, formic acid, malonic acid, lactic acid, etidronic acid, phosphonic acid (e.g., trimethylene phosphonic acid), or a combination thereof. For example, in some embodiments, the wet etch solution is a mixture of hydrogen peroxide and formic acid. In some embodiments, the wet etch solution is a mixture of hydrogen peroxide (or another peroxide compound) and lactic acid. In some embodiments, the wet etch solution is a mixture of hydrogen peroxide and citric acid. In some embodiments, the wet etch solution is a mixture of hydrogen peroxide and etidronic acid. In some embodiments, the wet etch solution is a mixture of hydrogen peroxide and phosphonic acid (e.g., nitrilotrismethylenephosphonic (NTMP) acid).

The etching of the material within the channel layer 106 may be retarded by saturating the wet etch solution with poorly soluble salts of the components of the channel layer (e.g. salts of indium, gallium, and/or zinc. For example, an indium-based salt, a gallium-based salt, and/or a zinc-based salt (e.g., fluorides, carbonates, phosphates, borates, arsenates, arsenites, cyanides, ferricyanides, oxalates, sulfites, sulfides, chromates, and/or silicates) may be added. The addition of such salts (i.e., salts based on metals within the channel layer 106) to the solution may increase the etch selectivity based on the principles of equilibrium chemistry (e.g., because the salt(s) add the metals within the channel layer 106 to the wet etch solution, the wet etch solution is less likely to etch materials including those same metals). The salts may be present in a concentration that is within about 10% of the solubility limit within the formulation.

More specifically, in some embodiments, wet etch solution includes at least one or more of the following components: an acidic solution with a pH below 7.0, preferably in the range of 1.0 to 7.0, pH buffer components to stabilize the pH of the formulation (e.g. citric acid/sodium citrate, acetic acid/sodium acetate, or buffered oxide etch (BOE), being a mixture of ammonium fluoride and hydrofluoric acid), complexing (i.e., chelating) agents that preferentially complex copper-based ions over the IGZO (e.g., cyclic compounds like crown ethers, or compounds like lactic acid, citric acid, formic acid, tartaric acid, malonic acid, and phosphonate compounds like etidronic acid, 1,2-diaminoethanetetrakismethylene phosphonic acid, nitrilotrismethylenephosphonic acid, or diethylenetriaminepentakismethylene phosphonic acid), surfactants bonding to the IGZO preferentially over the source/drain electrode material, and salts of the metals of the semiconductor material components with a low solubility (e.g., salts of indium, gallium, and zinc in case of IGZO semiconductor, such as fluorides, carbonates, phosphates, borates, arsenates, arsenites, cyanides, ferricyanides, oxalates, sulfites, sulfides, chromates, and silicates) to retard the etching of the IGZO.

The pH of the wet etch solution may be adjusted by using one or a mixture of more acids, such as organic acids (e.g. lactic acid, citric acid, formic acid, tartaric acid, malonic acid, and phosphonate compounds like etidronic acid, 1,2-diaminoethanetetrakismethylene phosphonic acid, nitrilotrismethylenephosphonic acid, or diethylenetriaminepentakismethylene phosphonic acid), or inorganic acids (e.g. hydrochloric acid (HCl), hydrobromic acid (HBr), sulfuric acid ($H_2SO_4$), nitric acid ($HNO_3$), phosphoric acid ($H_3PO_4$), etc.). In some embodiments, the wet etch solution does not cause significant damage to the IGZO that can not be repaired. Minor damage to the IGZO may be repaired by a subsequent wet or dry surface treatment.

In some embodiments in which the wet etch solution includes hydrogen peroxide and citric acid (along with water), the volumetric ratios of the respective components may be 1-3:0.5-4:9-13 (e.g., 1 ml hydrogen peroxide, 0.5 ml citric acid, and 9 ml water). As such, in some embodiments, the weight percent (wt %) of the hydrogen peroxide is between about 2% and about 6%. In some embodiments, the hydrogen peroxide is mixed with water (e.g., 30 wt % hydrogen peroxide in water) before being added to the solution. In some embodiments, pure acids are added to the solution, while in some embodiments, the acids are mixed with water.

After the source region 110 and the drain region 112 are formed, an exposed portion 114 of the IGZO channel layer 106 (i.e., between the source region 110 and the drain region 112) may be exposed to an acidic solution comprising hydrofluoric acid and/or hydrochloric acid to, for example, remove a thin (e.g., 10 nm) portion of the IGZO and any native oxide formed thereon and/or repair the surface of the exposed portion 114 of the IGZO channel layer 106 to improve device performance.

Figure 6:
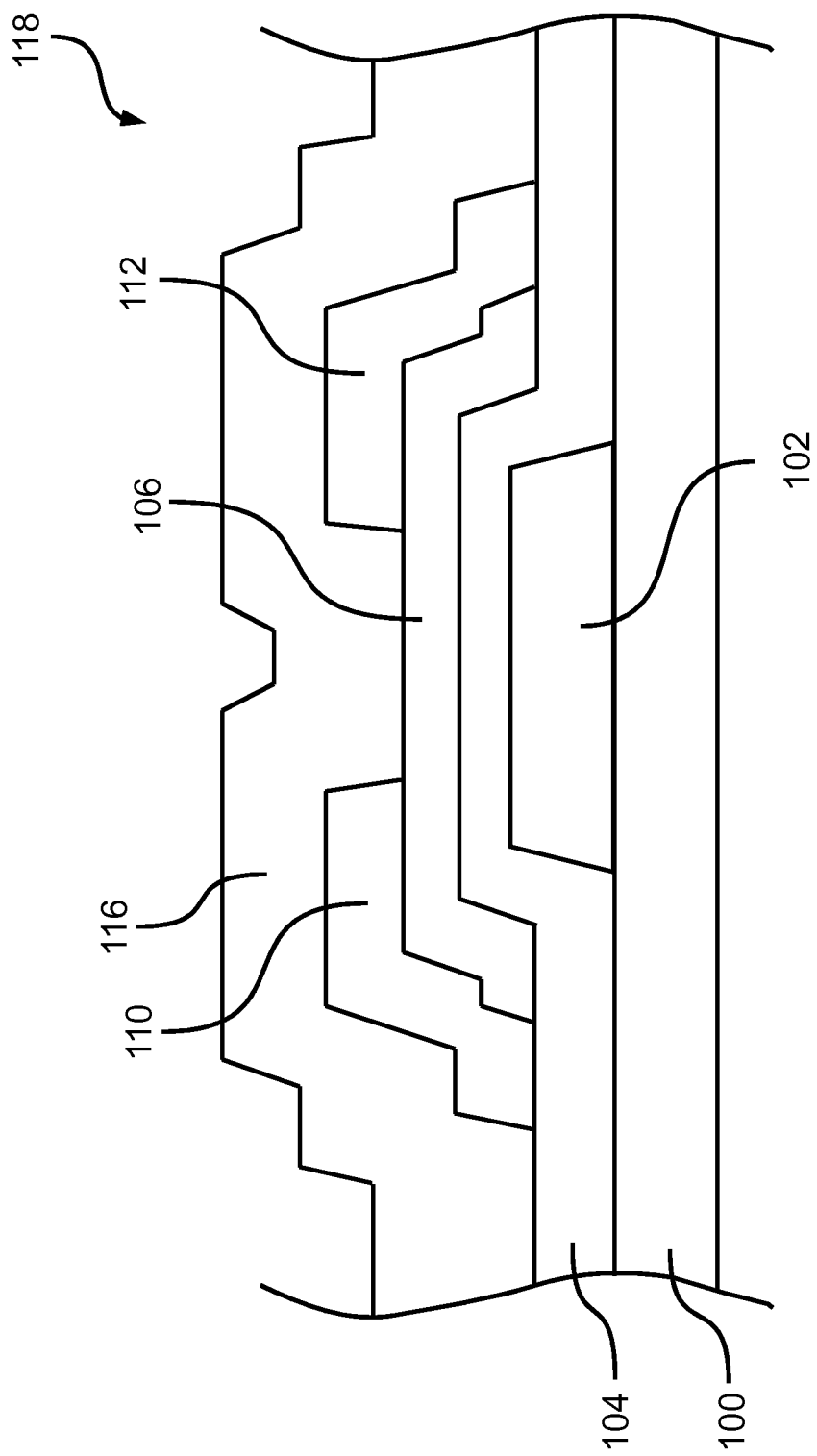
FIG. 6 is a cross-sectional view of the substrate of FIG. 5 with a passivation layer formed above the source and drain regions.

Referring to FIG. 6, a passivation layer 116 is then formed above the source region 110, the drain region 112, and the exposed regions of the gate dielectric layer 104 and exposed regions of the channel layer 106. Examples of suitable materials for the passivation layer include silicon oxide, silicon nitride, silicon oxy-nitride, a stack of silicon nitride and silicon oxide, a mixture, multi-layer, or combination thereof. In some embodiments, the passivation layer 116 includes a high bandgap (e.g., aluminum oxide) and/or a high-k dielectric material (e.g. hafnium oxide, zirconium oxide, titanium oxide). The passivation layer 116 may have a thickness of, for example, between about 0.1 μm and about 1.5 μm.

The deposition of the passivation layer 116 may substantially complete the formation of an IGZO device 118, such as an inverted, staggered bottom-gate IGZO TFT. It should be understood that although only a single device 118 is shown as being formed on a particular portion of the substrate 100 in FIGS. 1-6, the manufacturing processes described above may be simultaneously performed on multiple portions of the substrate 100 such that multiple devices 118 are simultaneously formed, as is commonly understood.

Due to the high etching selectivity of the wet etch solutions described herein (e.g., an etch selectivity of 25× for copper-based materials over IGZO), the need for an etch stop layer (typically formed above the IGZO layer) is reduced, if not completely eliminated. As a result, manufacturing costs are reduced, as at least two manufacturing steps may be eliminated (e.g., the deposition of the etch stop layer and the patterning of the etch stop layer).

FIG. 7 is a table depicting data related to several samples of wet etching solutions formed in accordance with some embodiments. As shown, the samples included etidronic acid, formic acid, lactic acid, citric acid, or NTMP acid, and were used to etch copper of various thicknesses (e.g., 83.5 nm and 92.0 nm). The samples included various amount of hydrogen peroxide (e.g., 1.00 ml, 2.00, ml, and 4.00 ml), the acid (e.g., 1.00 ml, 2.00 ml, and 8.00 ml), and water (0.00 ml, 6.00 ml, 8.00 ml, and 12.00 ml). The resulting etch rates for copper (i.e., Cu ER) and IGZO (i.e., IGZO ER) and etch selectivity (e.g., Cu ER/IGZO ER) are shown in the last two columns. As shown, many of the samples exhibited an etch selectivity of over 25 (i.e., 25×), with the sample being made from 4.00 ml hydrogen peroxide, 1.00 ml of etidronic acid, and 8.00 ml of water exhibiting an etch selectivity of 418 (i.e., 418×).

Figure 8:
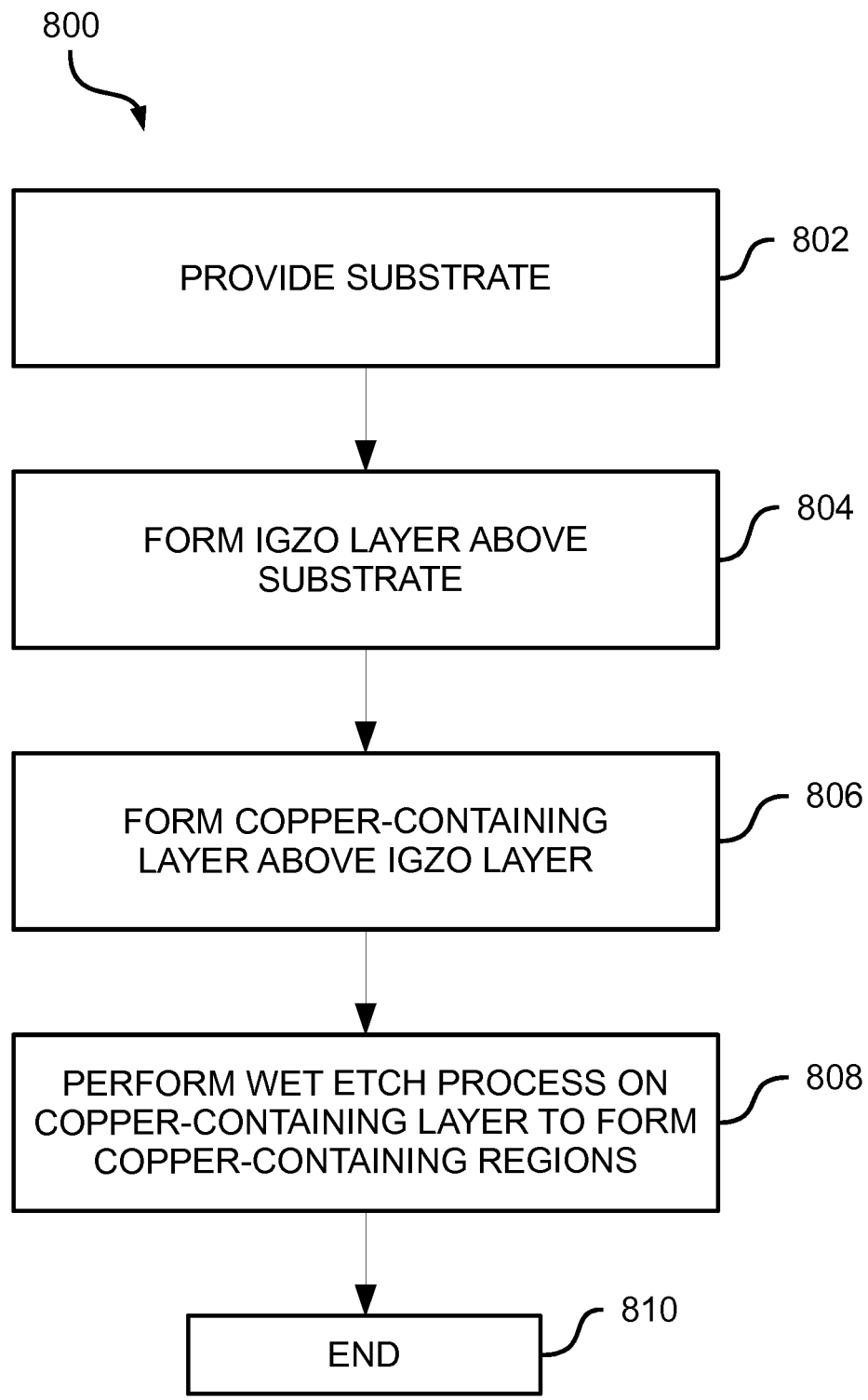
FIG. 8 is a flow chart illustrating a method for forming IGZO according to some embodiments.

FIG. 8 illustrates a method 800 for forming an IGZO device according to some embodiments. At block 802, the method 800 begins with a substrate being provided. As described above, the substrate may be made of glass.

At block 804, a channel layer is formed above the substrate. In some embodiments, the channel layer is made of IGZO and is formed as a channel layer in an IGZO device, such as an IGZO TFT. The channel layer may have a thickness of, for example, between about 20 nm and about 50 nm.

At block 806, a copper-containing (or electrode) layer is formed above the channel layer. In some embodiments, the electrode layer 108 includes two or more sub-layers and is made of copper along and at least one other material, such as molybdenum, manganese, titanium, a copper alloy, or a combination thereof. The copper-containing layer may have a thickness of, for example, between about 50 nm and 0.5 μm, yet might even be thicker.

At block 808, a wet etch process is performed on the copper-containing layer to form copper-containing regions from the copper-containing layer. The copper-containing regions may be source and drain regions (or electrodes). As described above, in some embodiments, the wet etch process is performed by exposing the copper-containing layer to a wet etch solution that includes a peroxide compound (e.g., hydrogen peroxide or the other examples described above) and at least one organic acid (e.g., in water or deionized water). The organic acid(s) may include citric acid, formic acid, malonic acid, lactic acid, etidronic acid, trimethylene phosphonic acid, or a combination thereof.

For example, in some embodiments, the wet etch solution is a mixture of hydrogen peroxide and formic acid. In some embodiments, the wet etch solution is a mixture of hydrogen peroxide and lactic acid. In some embodiments, the wet etch solution is a mixture of hydrogen peroxide and citric acid. In some embodiments, the wet etch solution is a mixture of hydrogen peroxide and etidronic acid. In some embodiments, the wet etch solution is a mixture of hydrogen peroxide and nitrilotrismethylenephosphonic acid.

One or more salt based on metals in the channel layer (e.g., an indium-based salt, a gallium-based salt, and/or a zinc-based salt (e.g., fluorides, carbonates, phosphates, borates, arsenates, arsenites, cyanides, ferricyanides, oxalates, sulfites, sulfides, chromates, and/or silicates) may be added to the wet etch solution. The addition of such salts (i.e., salts based on metals within the channel layer) to the solution may increase the etch selectivity based on the principles of equilibrium chemistry (e.g., because the salt(s) add the metals within the channel layer to the wet etch solution, the wet etch solution is less likely to etch materials including those same metals).

More specifically, in some embodiments, wet etch solution includes at least one or more of the following components: an acidic solution with a pH below 7.0, preferably in the range of 1.0 to 7.0, pH buffer components to stabilize the pH of the formulation (e.g. citric acid/sodium citrate, acetic acid/sodium acetate, or buffered oxide etch (BOE), being a mixture of ammonium fluoride and hydrofluoric acid), complexing (i.e., chelating) agents that preferentially complex copper-based ions over the IGZO (e.g., cyclic compounds like crown ethers, or compounds like lactic acid, citric acid, formic acid, tartaric acid, malonic acid, and phosphonate compounds like etidronic acid, 1,2-diaminoethanetetrakismethylene phosphonic acid, nitrilotrismethylenephosphonic acid, or diethylenetriaminepentakismethylene phosphonic acid), surfactants bonding to the IGZO preferentially over the source/drain electrode material, and salts of the metals of the semiconductor material components with a low solubility (e.g., salts of indium, gallium, and zinc in case of IGZO semiconductor, such as fluorides, carbonates, phosphates, borates, arsenates, arsenites, cyanides, ferricyanides, oxalates, sulfites, sulfides, chromates, and silicates) to retard the etching of the IGZO.

The pH of the wet etch solution may be adjusted by using one or a mixture of more acids, such as organic acids (e.g. lactic acid, citric acid, formic acid, tartaric acid, malonic acid, and phosphonate compounds like etidronic acid, 1,2-diaminoethanetetrakismethylene phosphonic acid, nitrilotrismethylenephosphonic acid, or diethylenetriaminepentakismethylene phosphonic acid), or inorganic acids (e.g. hydrochloric acid (HCl), hydrobromic acid (HBr), sulfuric acid ($H_2SO_4$), nitric acid ($HNO_3$), phosphoric acid ($H_3PO_4$), etc.). In some embodiments, the wet etch solution does not cause significant damage to the IGZO that can not be repaired. Minor damage to the IGZO may be repaired by a subsequent wet or dry surface treatment.

In some embodiments in which the wet etch solution includes hydrogen peroxide and citric acid (along with water), the volumetric ratios of the respective components may be 1-3:0.5-4:9-13 (e.g., 1 ml hydrogen peroxide, 0.5 ml citric acid, and 9 ml water). As such, in some embodiments, the weight percent (wt %) of the hydrogen peroxide is between about 2% and about 6%.

In some embodiments, the IGZO layer and the source and drain regions are formed as components in an IGZO device, such as an IGZO TFT. As such, although not shown, in some embodiments, the method 800 includes the formation of additional components for an IGZO device, such as the gate electrode, gate dielectric layer, source/drain regions, etc., as well as patterning the various layer/components (e.g., via a photolithography process and an etching process). At block 810, the method 800 ends.

Thus, in some embodiments, methods for forming an IGZO device are provided. A substrate is provided. An IGZO layer is formed above the substrate. A copper-containing layer is formed above the IGZO layer. A wet etch process is performed on the copper-containing layer to form copper-containing regions above the IGZO layer. The performing of the wet etch process on the copper-containing layer includes exposing the copper-containing layer to an etching solution including hydrogen peroxide and one of citric acid, formic acid, malonic acid, lactic acid, etidronic acid, phosphonic acid, or a combination thereof.

In some embodiments, methods for forming an IGZO device are provided. A transparent substrate is provided. A gate electrode is formed above the transparent substrate. An IGZO layer is formed above the gate electrode. A copper-containing layer is formed above the IGZO layer. A wet etch process is performed on the copper-containing layer to form a source region and a drain region above the IGZO layer. The performing of the wet etch process on the copper-containing layer includes exposing the copper-containing layer to an etching solution including hydrogen peroxide and one of citric acid, formic acid, malonic acid, lactic acid, etidronic acid, phosphonic acid, or a combination thereof.

In some embodiments, a method for forming an IGZO device is provided. A transparent substrate is provided. A gate electrode is formed above the transparent substrate. The gate electrode includes copper, molybdenum, aluminum, or a combination thereof. A gate dielectric layer is formed above the gate electrode. An IGZO layer is formed above the gate dielectric layer. A copper-containing layer is formed above the IGZO layer. A wet etch process is performed on the copper-containing layer to form a source region and a drain region above the IGZO layer. The performing of the wet etch process on the copper-containing layer includes exposing the copper-containing layer to an etching solution including a peroxide compound and one of citric acid, formic acid, malonic acid, lactic acid, etidronic acid, phosphonic acid, or a combination thereof.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming an indium-gallium-zinc oxide (IGZO) device, the method comprising:
   providing a substrate;
   forming an IGZO layer above the substrate;
   forming a copper-containing layer above the IGZO layer; and
   performing a wet etch process on the copper-containing layer to form copper-containing regions above the IGZO layer, wherein the performing the wet etch process on the copper-containing layer comprises exposing the copper-containing layer to an etching solution comprising a peroxide compound and one of formic acid, malonic acid, lactic acid, etidronic acid, phosphonic acid, or a combination thereof.

2. The method of claim 1, wherein the etching solution further comprises at least one of an indium-based salt, a gallium-based salt, a zinc-based salt, or a combination thereof.

3. The method of claim 1, wherein after the performing of the wet etch process on the copper-containing layer, a portion of the IGZO layer between the source region and the drain region is exposed.

4. The method of claim 3, further comprising exposing the exposed portion of the IGZO layer to an acidic solution comprising hydrofluoric acid, hydrochloric acid, or a combination thereof.

5. The method of claim 1, wherein the copper-containing layer further comprises manganese, molybdenum, titanium, or a combination thereof.

6. The method of claim 1, further comprising forming a gate electrode above the substrate, wherein the IGZO layer is formed above the gate electrode.

7. The method of claim 6, wherein the gate electrode comprises copper, silver, aluminum, manganese, molybdenum, or a combination thereof.

8. The method of claim 6, further comprising forming a gate dielectric layer above the gate electrode, wherein the IGZO layer is formed above the gate dielectric layer.

9. The method of claim 8, further comprising forming a passivation layer above the source region and the drain region.

10. The method of claim 9, wherein the substrate comprises glass.

11. A method for forming an indium-gallium-zinc oxide (IGZO) device, the method comprising:
    providing a transparent substrate;
    forming a gate electrode above the transparent substrate;
    forming an IGZO layer above the gate electrode;
    forming a copper-containing layer above the IGZO layer; and
    performing a wet etch process on the copper-containing layer to form a source region and a drain region above the IGZO layer, wherein the performing the wet etch process on the copper-containing layer comprises exposing the copper-containing layer to an etching solution comprising a peroxide compound and one of formic acid, malonic acid, lactic acid, etidronic acid, phosphonic acid, or a combination thereof.

12. The method of claim 11, further comprising forming a gate dielectric layer above the gate electrode, wherein the IGZO layer is formed above the gate dielectric layer.

13. The method of claim 12, wherein the gate electrode comprises one of copper, silver, aluminum, manganese, molybdenum, or a combination thereof.

14. The method of claim 12, wherein after the performing of the wet etch process on the copper-containing layer, a portion of the IGZO layer between the source region and the drain region is exposed, and further comprising exposing the exposed portion of the IGZO layer to an acidic solution comprising hydrofluoric acid, hydrochloric acid, or a combination thereof.

15. The method of claim 12, wherein the etching solution further comprises at least one of an indium-based salt, a gallium-based salt, a zinc-based salt, or a combination thereof dissolved therein.

16. A method for forming an indium-gallium-zinc oxide (IGZO) device, the method comprising:

providing a transparent substrate;

forming a gate electrode above the transparent substrate, wherein the gate electrode comprises one of copper, silver, aluminum, manganese, molybdenum, or a combination thereof;

forming a gate dielectric layer above the gate electrode;

forming an IGZO layer above the gate dielectric layer;

forming a copper-containing layer above the IGZO layer; and performing a wet etch process on the copper-containing layer to form a source region and a drain region above the IGZO layer, wherein the performing the wet etch process on the copper-containing layer comprises exposing the copper-containing layer to an etching solution comprising hydrogen peroxide and one of citric acid, formic acid, malonic acid, lactic acid, etidronic acid, phosphonic acid, or a combination thereof, wherein the etching solution further comprises at least one of an indium-based salt, a gallium-based salt, a zinc-based salt, or a combination thereof dissolved therein.

17. The method of claim 16, wherein after the performing of the wet etch process on the copper-containing layer, a portion of the IGZO layer between the source region and the drain region is exposed, and further comprising exposing the exposed portion of the IGZO layer to an acidic solution comprising hydrofluoric acid, hydrochloric acid, or a combination thereof.

18. The method of claim 17, wherein the copper-containing layer further comprises manganese, molybdenum, titanium, or a combination thereof.

19. The method of claim 18, wherein the transparent substrate comprises glass.

* * * * *